United States Patent [19]

Shimakawa et al.

[11] Patent Number: 5,759,434
[45] Date of Patent: Jun. 2, 1998

[54] COMPOUND MAGNETORESISTIVE MATERIAL AND METHOD FOR PREPARING THE SAME

[75] Inventors: Yuichi Shimakawa; Yoshimi Kubo; Takashi Manako, all of Tokyo, Japan

[73] Assignee: NEC Corporation, Tokyo, Japan

[21] Appl. No.: 684,052

[22] Filed: Jul. 22, 1996

[30] Foreign Application Priority Data

Jul. 20, 1995 [JP] Japan ................................ 7-228673

[51] Int. Cl.$^6$ .................................................. G01R 33/06
[52] U.S. Cl. ..................... 252/62.51 R; 423/599; 423/593; 428/692
[58] Field of Search ................ 252/62.51 R; 423/599, 423/593; 117/947, 49, 73, 81; 428/692; 427/248.1, 596, 128; 204/192.1; 505/162, 121, 120, 451, 470, 479

[56] References Cited

U.S. PATENT DOCUMENTS

| | | | |
|---|---|---|---|
| 4,929,592 | 5/1990 | Gopalakrishnan et al. | 505/120 |
| 5,330,966 | 7/1994 | Hayashi et al. | 505/473 |
| 5,444,040 | 8/1995 | Kojima et al. | 505/451 |
| 5,462,921 | 10/1995 | Adachi et al. | 505/473 |
| 5,556,830 | 9/1996 | Sun et al. | 505/120 |

OTHER PUBLICATIONS

McKinnon et al. "Structure and Magnetism of $Bi_2(Sr,Ca)_2MnO_{6+y}$ antiferromagnetics with ferrimagnetic layers". Phys. rev. B, vol. 41(7), pp. 4489–501, Mar. 1, 1990.

*Primary Examiner*—Melissa Bonner
*Attorney, Agent, or Firm*—Young & Thompson

[57] ABSTRACT

The present invention provides a compound magnetoresistive material having a perovskite related structure and being represented by $M1_m M2_{n+1} M3_n Z_y$, where: M1 is a first metal comprising at least one element selected from the group consisting of Tl, Bi, Pb, and Hg; M2 is a second metal comprising at least one element selected from the group consisting of alkaline earth metals; M3 is a third metal comprising at least one element selected from the group consisting of Mn, Os, and Ru; Z is one selected from the group consisting of oxygen and anions in which some oxygen elements are replaced by Oh, F, B, Cl, Br, S, Se and Te; m is equal to 1 or 2; $1 \leq n \leq 4$; y is variable and depends upon a kind of elements constituting the perovskite related structure, a ratio of composition thereof, and synthesis conditions thereof.

34 Claims, No Drawings

COMPOUND MAGNETORESISTIVE MATERIAL AND METHOD FOR PREPARING THE SAME

BACKGROUND OF THE INVENTION

The present invention relates to a compound magnetoresistive material having a large magnetoresistance effect and being useful for a magnetic detector or sensor, and a method for preparing the compound magnetoresistive material.

Magnetoresistance effect is utilized to detect any variations of magnetic field by converting the same into variations of electric resistance. Typical magnetic detectors utilizing the magnetoresistance effect are, for example, magnetic heads and magnetic sensors. Permalloy alloy is one of the magnetoresistive materials which exhibit the magnetoresistance effect, wherein permalloy alloy exhibits an anisotropic magnetoresistance effect.

Recently, there has been developed a technique for forming a Fe/Cr magnetic super-lattice structure by use of a molecular beam epitaxy method, wherein as ferromagnetic layers FE layers and as non-magnetic layers Cr layers are alternatively laminated as well as a technique for forming a granular monolayer by a deposition of a magnetic metal in a non-magnetic metal.

The requirement for more memory density in magnetic recording mediums has recently been on the increase and it is presumable that such requirement will further increase in future. The increase in the memory density of magnetic recording mediums requires a certain reduction in intensity of magnetic signals having been stored in the magnetic recording mediums, namely, the magnetic signal stored in the magnetic recording mediums has to be feeble in order to satisfy the requirement for an increase in memory density of magnetic recording mediums. In order to detect such feeble magnetic signals as stored in the magnetic recording mediums, it is required to have the magnetoresistive material possess a very high sensitivity to the magnetic field generated by the magnetic signals stored in the magnetic recording mediums. To satisfy the requirement for the high magnetic sensitivity possessed by the magnetoresistive material, it is required that the electric resistance of the magnetoresistive material is varied as large as possible in response to slight variations in intensity of such feeble magnetic fields. Further to detect the feeble magnetic signals without error, it is also essential that the electric resistance of the magnetoresistive material have large variations possible in response to slight variations in intensity of such feeble magnetic fields.

The above permalloy alloy shows only a small variation in electric resistance at a few percents variation of the magnetic field. The above Fe/Cr magnetic super-lattice structure obtained by use of the molecular beam epitaxy method as well as the above granular monolayer obtained by the deposition of the magnetic metal in the non-magnetic metal also are capable of causing only small variations in electric resistance as compared to the variation of the magnetic field. The foregoing conventional permalloy alloy, granular monolayer and Fe/Cr magnetic super-lattice structure are incapable of satisfying the requirement for high density recording.

Accordingly, one of the most important properties for the magnetoresistive materials which satisfy the requirement for high density recording is to cause a large variation in the electric resistance in response to an extremely small variation of a feeble magnetic field. In the light of the above, it had been required to develop an improved compound magnetoresistive material which is capable of causing a large variation in the electric resistance in response to an extremely small variation of a feeble magnetic field. It is further required to develop a method for preparing an improved compound magnetoresistive material which is capable of causing a large variation in the electric resistance in response to an extremely small variation of a feeble magnetic field.

SUMMARY OF THE INVENTION

Accordingly, it is an object of the present invention to provide a compound magnetoresistive material showing a large magnetoresistive effect.

It is a further object of the present invention to provide a compound magnetoresistive material showing a large variation in electric resistance in response to an extremely small variation of a feeble magnetic field.

It is a furthermore object of the present invention to provide a compound magnetoresistive material which is capable of sensing any feeble magnetic signals stored in a magnetic recording medium by use of its property of a large magnetoresistive effect.

It is a still further object of the present invention to provide a method for preparing a compound magnetoresistive material showing a large magnetoresistive effect.

It is yet a further object of the present invention to provide a method for preparing a compound magnetoresistive material showing a large variation in electric resistance in response to an extremely small variation of a feeble magnetic field.

It is moreover another object of the present invention to provide a method for preparing a compound magnetoresistive material which is capable of sensing any feeble magnetic signals stored in a magnetic recording medium by use of its property of a large magnetoresistive effect.

It is another object of the present invention to provide a compound magnetoresistive material for a magnetic sensor which is capable of sensing any feeble magnetic signals stored in a magnetic recording medium by use of its property of a large magnetoresistive effect.

It is still another object of the present invention to provide a compound magnetoresistive material for a magnetic head which is capable of sensing any feeble magnetic signals stored in a magnetic recording medium by use of its property of a large magnetoresistive effect.

The above and other objects, features and advantages of the present invention will be apparent from the following descriptions.

The present invention provides a compound magnetoresistive material having a perovskite related structure and being represented by $M1_m M2_{n+1} M3_n Z_y$, where: M1 is a first metal comprising at least one element selected from the group consisting of Tl, Bi, Pb, and Hg; M2 is a second metal comprising at least one element selected from the group consisting of alkaline earth metals; M3 is a third metal comprising at least one element selected from the group consisting of Mn, Os and Ru; Z is one selected from the group consisting of oxygen and anions in which some oxygen elements are replaced by OH, F, B, Cl, Br, S, Se and Te; m is equal to 1 or 2; $1 \leq n \leq 4$; y is variable and depends upon a kind of elements constituting the perovskite related structure, a ratio of composition thereof, and synthesis conditions thereof.

The present invention also provides the magnetic sensor made of a magnetoresistive material just mentioned.

The present invention also provides a method for preparing the magnetoresistive material having just mentioned. The method comprises the following steps. A first metal oxide, a second metal oxide and a third metal oxide are mixed, wherein the first metal oxide comprises at least one metal oxide selected from the group consisting of thallium oxide, bismuth oxide, lead oxide and mercury oxide; the second metal oxide comprises at least one metal oxide selected from the group consisting of alkaline earth metal oxides; and the third metal oxide comprises at least one metal oxide selected from the group consisting of manganese oxide, osmium oxides, and ruthenium oxides. The mixed first, second and third metal oxides are burned to form a magnetoresistive ceramic.

The present invention also provides a method for preparing a thin film magnetic sensor formed on a substrate in which the magnetoresistive ceramic just mentioned is deposited onto the substrate.

DISCLOSURE OF THE INVENTION

According to the present invention, a compound magnetoresistive material has a perovskite related structure which is represented by $M1_m M2_{n+1} M3_n Z_y$, where: M1 is a first metal comprising at least one element selected from the group consisting of Ti, Bi, Pb, and Hg; M2 is a second metal comprising at least one element selected from the group consisting of alkaline earth metals; M3 is a third metal comprising at least one element selected from the group consisting of Mn, Os and Ru; Z is one selected from the group consisting of oxygen and a nonmetal of oxygen elements partially replaced by OH, F, B, Cl, Br, S, Se and Te; m is equal to 1 or 2; $1 \leq n \leq 4$; y is variable and depends upon a kind of elements constituting the perovskite related structure, a ratio of composition thereof, and synthesis conditions thereof.

The above compound magnetoresistive material is classified into the magnetic oxides. A typical one of the above compound magnetoresistive materials is one represented by $(TlO)_m(R_{n+1}Mn_n O_{3n+1})$, where R is the alkaline earth metals. A TlO layer or a $Tl_2 O_2$ layer is inserted between perovskite structural units.

The above compound magnetoresistive material having the perovskite related structure and being represented by $M1_m M2_{n+1} M3_n Z_y$ shows a magnetic transition between ferromagnetism and paramagnetism. At a temperature over a magnetic transition temperature, the above compound magnetoresistive material shows paramagnetism, wherein a weak interaction appears between magnetic spins of the transition metals such as Mn. By contrast, at a temperature under the magnetic transition temperature, the magnetic spins are ordered and further transited to show a electrical conductivity like metals. In the light of variations of the electric resistance of the magnetoresistive material, as a temperature of the magnetoresistive material is dropped from 500 K, the electric resistance increases. If, however, the temperature of the magnetoresistive material falls under the magnetic transition temperature, the magnetic spins are ordered whereby a metal phase appears and the electric resistance is rapidly dropped. As a result, the magnetoresistive material shows a high electric conductivity like the metals.

When a temperature of the magnetoresistive material is in the vicinity of the magnetic transition temperature, the spins may not be completely ordered. If, however, an external magnetic field with a certain intensity is applied to the magnetoresistive material, then the spins are completely ordered whereby the electric resistance is reduced.

The phenomenon as described above is the magnetoresistive effect which is utilized in the present invention.

The magnetoresistive material having the perovskite related structure and being represented by $M1_m M2_{n+1} M3_n Z_y$ described above shows a phenomenon that at a temperature in the vicinity of the magnetic transition temperature, the spins come completely ordered even by applying an extremely weak and feeble magnetic field to the magnetoresistive material, whilst the spins are not ordered under no application of the magnetic field. If the spins come completely ordered, then the electric resistance of the magnetoresistive material is considerably dropped. This means that the magnetoresistive material having the perovskite related structure and being represented by $M1_m M2_{n+1} M3_n Z_y$ described above shows a considerable reduction in electric resistance upon application of a very weak and feeble magnetic field. If for example, a magnetic field of not less than 5 teslas is applied to this magnetoresistive material, then the electric resistance thereof is reduced by at least 50%.

As described above, the magnetoresistive material having the perovskite related structure and being represented by $M1_m M2_{n+1} M3_n Z_y$ described above utilizes the magnetoresistive effect at a temperature in the vicinity of the magnetic transition temperature at which the magnetoresistive material shows a magnetic transition between ferromagnetism and paramagnetism. The magnetic transition temperature depends upon the type of the second metal M2 and a composition ratio thereof, wherein the second metal M2 comprises at least one element selected from the group consisting of alkaline earth metals as described above. Namely, the magnetic transition temperature is varied in a relatively wide range by changing a kind of the second metal M2 and a composition ratio thereof. This means that it is possible to adjust the magnetic transition temperature at a desirable temperature by adjusting a kind of the second metal M2 and a composition ratio thereof. This further means that it is possible to design various magnetoresistive materials with various magnetic transition temperatures for use of a magnetic sensor made of the magnetoresistive material under various temperature conditions.

Further, as described above, the variable y indicating an amount of oxygen depends upon a kind of elements constituting the perovskite related structure, a ratio of composition thereof, and synthesis conditions, for example, burning conditions such as temperature, time and atmosphere. If, for example, the burning is made in an oxygen atmosphere, the variable y is likely to be larger than that when the burning is made an argon or nitrogen atmosphere. The variable y indicating an amount of oxygen is deeply related to a concentration of carriers providing a referenced electrical conductivity under no magnetic field applied to the magnetoresistive material. Namely, a referenced electrical resistivity under no magnetic field applied to the magnetoresistive material depends upon the amount of oxygen or the variable y. Since the variable y is varied by changing the burning conditions such is temperature, time and atmosphere, it is possible to adjust the referenced electrical conductivity and the referenced electrical resistivity by adjusting the burning conditions such as temperature, time and atmosphere.

The magnetoresistive material having the perovskite related structure and being represented by $Tl_m Sr_{n+1} Mn_n O_y$ may be synthesized by mixing powdered source materials and subsequent burning the same to be in the form of ceramics.

Alternatively, the magnetoresistive material having the perovskite related structure and being represented by $Tl_mSr_{n+1}Mn_nO_y$ may be synthesized by provisional burning of source materials and subsequent crushing of the burned source materials into powders, followed by mixing the powdered source materials before the main burning of the same to be in the form of ceramics.

The magnetoresistive material synthesized in the above manner may be melted at a high temperature for deposition thereof to obtain a monocrystal magnetoresistive material.

Alternatively, the magnetoresistive material synthesized in the above manner may be treated in accordance with a floating zone method to obtain a monocrystal magnetoresistive material.

Some combinations of the source materials remain in non-equilibrium under normal pressure. In this case, it is preferable to synthesize the source materials under a high pressure of, for example, not less than 2 GPa (20 kbar).

The magnetoresistive material synthesized in the form of ceramics or in the form of monocrystal may be deposited with a sputtering method, a laser ablation method, or a vacuum evaporation to form a thin film made of the magnetoresistive material which acts as a magnetic sensor to be incorporated in a magnetic receding and playback device. The thin film of the magnetoresistive material may generally be suitable in the light of minimization of the device and the workability of the magnetoresistive material.

In the light of the above descriptions, the constitutions of the present inventions conceived by the inventors are as follows.

The present invention provides a magnetoresistive material having a perovskite related structure and being represented by $M1_mM2_{n+1}M3_nZ_y$, where: M1 is a first metal comprising at least one element selected from the group consisting of Tl, Bi, Pb, and Hg; M2 is a second metal comprising at least one element selected from the group consisting of alkaline earth metals; M3 is a third metal comprising at least one element selected from the group consisting of Mn, Os and Ru; Z is one selected from the group consisting of oxygen and anions in which some oxygen elements are replaced by OH, F, B, Cl, Br, S, Se and Te; m is equal to 1 or 2; $1 \leq n \leq 4$ y is variable and depends upon a kind of elements constituting the perovskite related structure, a ratio of composition thereof, and synthesis conditions thereof.

It is preferable that the magnetoresistive material is represented by $(TlO)_m(R_{n+1}Mn_nO_{3n+1})$, where R is the alkaline earth metals; m is equal to 1 or 2; $1 \leq n \leq 4$.

It is also preferable that the magnetoresistive material comprises TlSrMnO, where a molar ratio of Tl:Sr:Mn is equal to 1:2:1. In this case, it is further preferable that the magnetoresistive material TlSrMnO, where a molar ratio of Tl:Sr:Mn is equal to 1:2:1, is prepared by mixing $Tl_2O_3$, SrO and MnO and subsequent burning thereof at a temperature of about 900° C. for about five hours.

It is also preferable that the magnetoresistive material comprises TlSrMnO, where a molar ratio of Tl:Sr:Mn is equal to 1:3:2. In this case, it is further preferable that the magnetoresistive material TlSrMnO, where a molar ratio of Tl:Sr:Mn is equal to 1:3:2, is prepared by mixing $Tl_2O_3$, SrO and MnO and subsequent burning thereof in an oxygen atmosphere at a temperature of about 900° C. for about five hours. In this case, it is alternatively preferable that the magnetoresistive material TlSrMnO, where a molar ratio of Tl:Sr:Mn is equal to 1:3:2, is prepared by mixing $Tl_2O_3$, SrO and MnO and subsequent burning thereof in an argon atmosphere at a temperature of about 900° C. for about five hours.

It is also preferable that the magnetoresistive material comprises BiSrMnO, where a molar ratio of Bi:Sr:Mn is equal to 2:3:2. In this case, it is further preferable that the magnetoresistive material BiSrMnO, where a molar ratio of Bi:Sr:Mn is equal to 2:3:2, is prepared by mixing $Bi_2O_3$, SrO and MnO and subsequent burning thereof at a temperature of about 940° C. for about five hours.

It is also preferable that the magnetoresistive material comprises HgSrLaMnO, where a molar ratio of Hg:Sr:La:Mn is equal to 1:2:1:2. In this case, it is further preferable that the magnetoresistive material HgSrLaMnO, where a molar ratio of Hg:Sr:La:Mn is equal to 1:2:1:2, is prepared by mixing HgO, SrO, $La_2O_3$ and MnO and subsequent burning thereof at a temperature of about 700° C. for about five hours.

It is also preferable that the magnetoresistive material comprises HgSrLaMnO, where a molar ratio of Hg:Sr:La:Mn is equal to 1:1:2:2. In this case, it is further preferable that the magnetoresistive material HgSrLaMnO, where a molar ratio of Hg:Sr:La:Mn is equal to 1:1:2:2, is prepared by mixing HgO, SrO, $La_2O_3$ and MnO and subsequent burning thereof at a temperature of about 700° C. for about five hours.

It is also preferable that the magnetoresistive material comprises $PbSr_3Mn_2O_8$. In this case, it is further preferable that the magnetoresistive material $PbSr_3Mn_2O_8$ is prepared by mixing PbO, SrO, and MnO and subsequent burning thereof at a temperature of about 750° C. for about twelve hours.

It is also preferable that the magnetoresistive material comprises TlSrRuO, where a molar ratio of Tl:Sr:Ru is equal to 1:2:1. In this case, it is further preferable that the magnetoresistive material TlSrRuO, where a molar ratio of Tl:Sr:Ru is equal to 1:2:1, is prepared by mixing $Tl_2O_3$, SrO, and $RuO_2$ and subsequent burning thereof under a pressure of about 3 GPa at a temperature of about 1000° C. for about one hour.

It is also preferable that the magnetoresistive material comprises $Bi_2Ba_2OsO_6$, where a molar ratio of Bi:Ba:Os is equal to 2:2:1. In this case, it is further preferable that the magnetoresistive material $Bi_2Ba_2OsO_6$ is prepared by mixing $Bi_2O_3$, BaO, and $OsO_4$ and subsequent burning thereof at a temperature of about 980° C. for about five hours.

The present invention also provides a magnetic sensor made of a magnetoresistive material described above.

It is preferable that the magnetoresistive material is in the form of a thin film provided on a substrate.

The present invention also provides a method for preparing the magnetoresistive material described above. The method comprises the following steps. A first metal oxide, a second metal oxide and a third metal oxide are mixed, wherein the first metal oxide comprises at least one metal oxide selected from the group consisting of thallium oxide, bismuth oxide, lead oxide and mercury oxide; the second metal oxide comprises at least one metal oxide selected from the group consisting of lanthanoid alkaline earth metal oxides; and the third metal oxide comprises at least one metal oxide selected from the group consisting of manganese oxide, osmium oxides, and ruthenium oxides. The mixed first, second and third metal oxides are burned to form a magnetoresistive ceramic.

It is preferable that $Tl_2O_3$, SrO and MnO are mixed so that a molar ratio of Tl:Sr:Mn is equal to 1:2:1 for subsequent burning thereof at a temperature of about 900° C. for about five hours.

It is also preferable that $Tl_2O_3$, SrO and MnO are mixed so that a molar ratio of Tl:Sr:Mn is equal to 1:3:2 for subsequent burning thereof in an oxygen atmosphere at a temperature of about 900° C. for about five hours.

It is also preferable that $Tl_2O_3$, SrO and MnO are mixed so that a molar ratio of Tl:Sr:Mn is equal to 1:3:2 for subsequent burning thereof in an argon atmosphere at a temperature of about 900° C. for about five hours.

It is also preferable that $Bi_2O_3$, SrO and MnO are mixed so that a molar ratio of Bi:Sr:Mn is equal to 2:3:2 for subsequent burning thereof at a temperature of about 940° C. for about five hours.

It is also preferable that HgO, SrO, $La_2O_3$ and MnO are mixed so that a molar ratio of Hg:Sr:La:Mn is equal to 1:2:1:2 for subsequent burning thereof at a temperature of about 700° C. for about five hours.

It is also preferable that HgO, SrO, $La_2O_3$ and MnO are mixed so that a molar ratio of Hg:Sr:La:Mn is equal to 1:1:2:2 for subsequent burning thereof at a temperature of about 700° C. for about five hours.

It is also preferable that PbO, SrO, and MnO are mixed so that a molar ratio of Pb:Sr:Mn is equal to 1:3:2 for subsequent burning thereof at a temperature of about 750° C. for about twelve hours.

It is also preferable that $Tl_2O_3$, SrO, and $RuO_2$ are mixed so that a molar ratio of Tl:Sr:Ru is equal to 1:2:1 for subsequent burning thereof under a pressure of about 3 GPa at a temperature of about 1000° C. for about one hour.

It is also preferable that $Bi_2O_3$, BaO, and $OsO_4$ are mixed so that a molar ratio of Bi:Ba:Os is equal to 2:2:1 for subsequent burning thereof at a temperature of about 980° C. for about five hours.

It is optional to add the steps of melting the magnetoresistive ceramic at a high temperature for subsequent precipitation to obtain a monocrystal magnetoresistive oxide.

It is also optional to add the step of treating the magnetoresistive ceramic in accordance with a floating zone method to obtain a monocrystal magnetoresistive oxide.

It is also optional to add the steps of provisional burning of the first, second and third metal oxides separately, and crushing the burned first, second and third metal oxides to obtain powders of the first, second and third metal oxides before mixing the powdered first, second and third metal oxides.

The present invention also provides a method for preparing a thin film magnetic sensor formed on a substrate. The thin film magnetic sensor is made of a magnetoresistive material prepared in the manner described above.

The magnetoresistive ceramic may be deposited onto the substrate by a sputtering method.

The magnetoresistive ceramic may be deposited onto the substrate by a laser abrasion method.

The magnetoresistive ceramic may be deposited onto the substrate by a vacuum evaporation method.

It is optional to add the steps of melting the magnetoresistive ceramic at a high temperature for subsequent precipitation to obtain a monocrystal magnetoresistive oxide before depositing the monocrystal magnetoresistive oxide onto the substrate.

The monocrystal magnetoresistive oxide may be deposited onto the substrate by a sputtering method.

The monocrystal magnetoresistive oxide may be deposited onto the substrate by a laser abrasion method.

The monocrystal magnetoresistive oxide may be deposited onto the substrate by a vacuum evaporation method.

It is optional to add the step of treating the magnetoresistive ceramic in accordance with a floating zone method to obtain a monocrystal magnetoresistive oxide before depositing the monocrystal magnetoresistive oxide onto the substrate.

It is optional to add the steps of provisional burning of the first, second and third metal oxides separately, and crushing the burned first, second and third metal oxides to obtain powders of the first, second and third metal oxides before mixing the powdered first, second and third metal oxides.

EXAMPLES

A first example according to the present invention will be described, wherein TlSrMnO magnetoresistive oxide was prepared. As source materials, $Tl_2O_3$, SrO and MnO were determined so that a molar ratio of Ti:Sr:Mn was equal to 1:2:1 for subsequent mixing of $Tl_2O_3$, SrO and MnO. The mixture was pressed to be in a predetermined shape, which was then wrapped by a gold foil for subsequent burning thereof at a temperature of 900° C. for five hours. The gold foil prevents evaporation of thallium element even a vapor pressure of thallium element was high. This prevents variations of compositions of the TlSrMnO magnetoresistive oxide. As a result, TlSrMnO magnetoresistive oxide was obtained.

A crystal structure of the TlSrMnO magnetoresistive oxide prepared was analyzed by an X-ray diffraction. It was confirmed that the crystal structure of the TlSrMnO magnetoresistive oxide was a perovskite related structure, wherein perovskite units including manganese ions and two dimensional layers comprising thallium elements and oxygen elements are alternately laminated.

The TlSrMnO magnetoresistive oxide prepared was attached with first terminals for supplying a current and second terminals for detecting voltage so that a magnetoresistance of the TlSrMnO magnetoresistive oxide was measured from a difference in electric resistance obtained from a ratio of an output voltage measured to an input current between when no external magnetic field was applied to the magnetoresistive oxide and when a predetermined magnetic field was applied to the magnetoresistive oxide.

First, the electric resistance of the TlSrMnO magnetoresistive oxide was measured under no external magnetic field. At a temperature in the vicinity of room temperature, the measured electric resistivity was approximately 1 $\Omega$ cm. At the temperature of the TlSrMnO magnetoresistive oxide was reduced, the measured electric resistivity thereof was increased so that at the temperature of the TlSrMnO magnetoresistive oxide was in the vicinity of 200 K, the measured electric resistivity thereof was 10 $\Omega$ cm. At the temperatures below 200 K, the measured electric resistivity was largely reduced into the range of several tens m $\Omega$ cm to several hundreds m $\Omega$ cm and the TlSrMnO magnetoresistive oxide showed a large electric conductivity like metals. The variation in electric resistivity of the TlSrMnO magnetoresistive oxide was largest at a temperature which was almost equal to a magnetic transition temperature at which a magnetic transition from paramagnetism to ferromagnetism of the TlSrMnO magnetoresistive oxide.

Second, the electric resistance of the TlSrMnO magnetoresistive oxide was measured under variable and weak external magnetic fields at a temperature in the vicinity of 200 K. As the external magnetic field applied to the TlSrMnO magnetoresistive oxide was gradually increased from 0 tesla, the electric resistance of the TlSrMnO magnetoresistive oxide was reduced. At the external magnetic field was 6 teslas, the electric resistance thereof was reduced to about 4 $\Omega$ cm. By contrast, under no external magnetic field applied to the TlSrMnO magnetoresistive oxide, the electric resistance thereof was 10 Ω cm. When the external magnetic field of 6 teslas was applied to the TlSrMnO magnetoresistive oxide at a temperature in the vicinity of 200 K, the electric resistance thereof was reduced by 60%, namely varied by −60%. Thus, the measured magnetoresistance effect was −60% at a temperature in the vicinity of 200 K under a magnetic field of 6 teslas.

A second example according to the present invention will be described, wherein TlSrMnO magnetoresistive oxide was prepared. As source materials, $Tl_2O_3$, SrO and MnO were determined so that a molar ratio of Tl:Sr:Mn was equal to 1:3:2 for subsequent mixing of $Tl_2O_3$, SrO and MnO. The mixture was pressed to be in a predetermined shape for subsequent burning thereof in an oxygen atmosphere at a temperature of 900° C. for five hours As a result, TlSrMnO magnetoresistive oxide was obtained.

A crystal structure of the TlSrMnO magnetoresistive oxide prepared was analyzed by an X-ray diffraction. It was confirmed that the crystal structure of the TlSrMnO magnetoresistive oxide was a perovskite related structure, wherein pairs of two perovskite units including manganese ions and two dimensional layers comprising thallium elements and oxygen elements are alternately laminated.

The TlSrMnO magnetoresistive oxide prepared was attached with first terminals for supplying a current and second terminals for detecting voltage so that a magnetoresistance of the TlSrMnO magnetoresistive oxide was measured from a difference in electric resistance obtained from a ratio of an output voltage measured to an input current between when no external magnetic field was applied to the magnetoresistive oxide and when a predetermined magnetic field was applied to the magnetoresistive oxide.

First, the electric resistance of the TlSrMnO magnetoresistive oxide was measured under no external magnetic field. At a temperature in the vicinity of room temperature, the measured electric resistivity was approximately 0.5 Ω cm. At a temperature in the vicinity of 250 K, the variation in measured electric resistivity of the TlSrMnO magnetoresistive oxide was largest. At the temperatures below 250 K, the measured electric resistivity was largely reduced and the TlSrMnO magnetoresistive oxide showed a large electric conductivity like metals. The temperature in the vicinity of 250 K was almost equal to a magnetic transition temperature at which a magnetic transition from paramagnetism to ferromagnetism of the TlSrMnO magnetoresistive oxide.

Second, the electric resistance of the TlSrMnO magnetoresistive oxide was measured under variable and weak external magnetic fields at a temperature in the vicinity of 250 K. As the external magnetic field applied to the TlSrMnO magnetoresistive oxide was gradually increased from 0 tesla, the electric resistance of the TlSrMnO magnetoresistive oxide was reduced. At the external magnetic field was 6 teslas, the electric resistance thereof was reduced by approximately 50%, namely varied by approximately −50%. Thus, the measured magnetoresistance effect was −50% at a temperature in the vicinity of 250 K under a magnetic field of 6 teslas.

A third example according to the present invention will be described, wherein TlSrMnO magnetoresistive oxide was prepared. As source materials, $Tl_2O_3$, SrO and MnO were determined so that a molar ratio of Tl:Sr:Mn was equal to 1:3:2 for subsequent mixing of $Tl_2O_3$, SrO and MnO. The mixture was pressed to be in a predetermined shape for subsequent burning thereof in an argon atmosphere at a temperature of 900° C. for five hours. As a result, TlSrMnO magnetoresistive oxide was obtained.

A crystal structure of the TlSrMnO magnetoresistive oxide prepared was analyzed by an X-ray diffraction. It was confirmed that the crystal structure of the TlSrMnO magnetoresistive oxide was a perovskite related structure, wherein pairs of two perovskite units including manganese ions and two dimensional layers comprising thallium elements and oxygen elements are alternately laminated.

The TlSrMnO magnetoresistive oxide prepared was attached with first terminals for supplying a current and second terminals for detecting voltage so that a magnetoresistance of the TlSrMnO magnetoresistive oxide was measured from a difference in electric resistance obtained from a ratio of an output voltage measured to an input current between when no external magnetic field was applied to the magnetoresistive oxide and when a predetermined magnetic field was applied to the magnetoresistive oxide.

First, the electric resistance of the TlSrMnO magnetoresistive oxide was measured under no external magnetic field. At a temperature in the vicinity of room temperature, the measured electric resistivity was approximately 1 Ω cm. At a temperature in the vicinity of 250 K, the variation in measured electric resistivity of the TlSrMnO magnetoresistive oxide was largest. At the temperatures below 200 K, the measured electric resistivity was largely reduced and the TlSrMnO magnetoresistive oxide showed a large electric conductivity like metals. The temperature in the vicinity of 200 K was almost equal to a magnetic transition temperature at which a magnetic transition from paramagnetism to ferromagnetism of the TlSrMnO magnetoresistive oxide.

Second, the electric resistance of the TlSrMnO magnetoresistive oxide was measured under variable and weak external magnetic fields at a temperature in the vicinity of 200 K. As the external magnetic field applied to the TlSrMnO magnetoresistive oxide was gradually increased from 0 tesla, the electric resistance of the TlSrMnO magnetoresistive oxide was reduced. At the external magnetic field was 6 teslas, the electric resistance thereof was reduced by approximately −60%, namely varied by approximately −60%. Thus, the measured magnetoresistance effect was −60% at a temperature in the vicinity of 200 K under a magnetic field of 6 teslas.

A fourth example according to the present invention will be described, wherein BiSrMnO magnetoresistive oxide was prepared. As source materials, $Bi_2O_3$, SrO and MnO were determined so that a molar ratio of Tl:Sr:Mn was equal to 2:3:2 for subsequent mixing of $Bi_2O_3$, SrO and MnO. The mixture was pressed to be in a predetermined shape for subsequent burning thereof at a temperature of 940° C. for five hours. As a result, BiSrMnO magnetoresistive oxide was obtained.

A crystal structure of the BiSrMnO magnetoresistive oxide prepared was analyzed by an X-ray diffraction. It was confirmed that the crystal structure of the BiSrMnO magnetoresistive oxide was a perovskite related structure, wherein pairs of two perovskite units including manganese ions and two dimensional layers comprising bismuth elements and oxygen elements are alternately laminated.

The BiSrMnO magnetoresistive oxide prepared was attached with first terminals for supplying a current and second terminals for detecting voltage so that a magnetoresistance of the BiSrMnO magnetoresistive oxide was measured from a difference in electric resistance obtained from a ratio of an output voltage measured to an input current between when no external magnetic field was applied to the magnetoresistive oxide and when a predetermined magnetic field was applied to the magnetoresistive oxide.

First, the electric resistance of the BiSrMnO magnetoresistive oxide was measured under no external magnetic field. At a temperature in the vicinity of a magnetic transition temperature, the measured electric resistivity was largely reduced and the BiSrMnO magnetoresistive oxide showed a large electric conductivity like metals.

Second, the electric resistance of the BiSrMnO magnetoresistive oxide was measured under variable and weak external magnetic fields at a temperature in the vicinity of the magnetic transition temperature. As the external magnetic field applied to the BiSrMnO magnetoresistive oxide was gradually increased from 0 tesla, the electric resistance of the BiSrMnO magnetoresistive oxide was reduced. At the external magnetic field was 6 teslas, the electric resistance thereof was reduced by approximately 50%, namely varied by approximately −50%. Thus, the measured magnetoresistance effect was −50% at a temperature in the vicinity of the magnetic transition temperature under a magnetic field of 6 teslas.

A fifth example according to the present invention will be described, wherein HgSrLaMnO magnetoresistive oxide was prepared. As source materials, HgO, SrO, $La_2O_3$ and MnO were determined so that a molar ratio of Hg:Sr:La:Mn was equal to 1:2:1:2 for subsequent mixing of HgO, SrO, $La_2O_3$ and MnO. The mixture was pressed to be in a predetermined shape for subsequent burning thereof at a temperature of 700° C. for five hours. As a result, HgSrLaMnO magnetoresistive oxide was obtained.

A crystal structure of the HgSrLaMnO magnetoresistive oxide prepared was analyzed by an X-ray diffraction. It was confirmed that the crystal structure of the HgSrLaMnO magnetoresistive oxide was a perovskite related structure having two dimensional layers comprising mercury elements and oxygen elements.

The HgSrLaMnO magnetoresistive oxide prepared was attached with first terminals for supplying a current and second terminals for detecting voltage so that a magnetoresistance of the HgSrLaMnO magnetoresistive oxide was measured from a difference in electric resistance obtained from a ratio of an output voltage measured to an input current between when no external magnetic field was applied to the magnetoresistive oxide and when a predetermined magnetic field was applied to the magnetoresistive oxide.

First, the electric resistance of the HgSrLaMnO magnetoresistive oxide was measured under no external magnetic field. At a temperature in the vicinity of 150 K, the variation in measured electric resistivity of the HgSrLaMnO magnetoresistive oxide was largest. At the temperatures below 150 K, the measured electric resistivity was largely reduced and the HgsrLaMnO magnetoresistive oxide showed a large electric conductivity like metals. The temperature in the vicinity of 150 K was almost equal to a magnetic transition temperature at which a magnetic transition from paramagnetism to ferromagnetism of the HgSrLaMnO magnetoresistive oxide.

Second, the electric resistance of the HgSrLaMnO magnetoresistive oxide was measured under variable and weak external magnetic fields at a temperature in the vicinity of 150 K. As the external magnetic field applied to the HgSrLaMnO magnetoresistive oxide was gradually increased from 0 tesla, the electric resistance of the HgSrLaMnO magnetoresistive oxide was reduced. At the external magnetic field was 6 teslas, the electric resistance thereof was reduced by approximately 75%, namely varied by approximately −75%. Thus, the measured magnetoresistance effect was −75% at a temperature in the vicinity of 150 K under a magnetic field of 6 teslas.

A sixth example according to the present invention will be described, wherein HgSrLaMnO magnetoresistive oxide was prepared. As source materials, HgO, SrO, $La_2O_3$ and MnO were determined so that a molar ratio of Hg:Sr:La:Mn was equal to 1:1:2:2 for subsequent mixing of HgO, SrO, $La_2O_3$ and MnO. The mixture was pressed to be in a predetermined shape for subsequent burning thereof at a temperature of 700° C. for five hours. As a result, HgSrLaMnO magnetoresistive oxide was obtained.

A crystal structure of the HgSrLaMnO magnetoresistive oxide prepared was analyzed by an X-ray diffraction. It was confirmed that the crystal structure of the HgSrLaMnO magnetoresistive oxide was a perovskite related structure having two dimensional layers comprising mercury elements and oxygen elements.

The HgSrLaMnO magnetoresistive oxide prepared was attached with first terminals for supplying a current and second terminals for detecting voltage so that a magnetoresistance of the HgSrLaMnO magnetoresistive oxide was measured from a difference in electric resistance obtained from a ratio of an output voltage measured to an input current between when no external magnetic field was applied to the magnetoresistive oxide and when a predetermined magnetic field was applied to the magnetoresistive oxide.

First, the electric resistance of the HgSrLaMnO magnetoresistive oxide was measured under no external magnetic field. At a temperature in the vicinity of 250 K, the variation in measured electric resistivity of the HgSrLaMnO magnetoresistive oxide was largest. At the temperatures below 250 K, the measured electric resistivity was largely reduced and the HgSrLaMnO magnetoresistive oxide showed a large electric conductivity like metals. The temperature in the vicinity of 250 K was almost equal to a magnetic transition temperature at which a magnetic transition from paramagnetism to ferromagnetism of the HgSrLaMnO magnetoresistive oxide.

Second, the electric resistance of the HgSrLaMnO magnetoresistive oxide was measured under variable and weak external magnetic fields at a temperature in the vicinity of 250 K. As the external magnetic field applied to the HgSrLaMnO magnetoresistive oxide was gradually increased from 0 tesla, the electric resistance of the HgSrLaMnO magnetoresistive oxide was reduced. At the external magnetic field was 6 teslas, the electric resistance thereof was reduced by approximately 60%, namely varied by approximately −60%. Thus, the measured magnetoresistance effect was −60% at a temperature in the vicinity of 250 K under a magnetic field of 6 teslas.

A seventh example according to the present invention will be described, wherein $PbSr_3Mn_2O_8$ magnetoresistive oxide was prepared. As source materials, PbO, SrO and MnO were powdered and determined so that a molar ratio of Pb:Sr:Mn was equal to 1:3:2 for subsequent mixing of PbO, SrO and MnO. The mixture was pressed to be in a predetermined shape for subsequent burning thereof at a temperature of 750° C. for twelve hours. As a result, $PbSr_3Mn_2O_8$ magnetoresistive oxide was obtained in the form of pellets. The pellets of the $PbSr_3Mn_2O_8$ magnetoresistive oxide were used as a target for a laser abrasion by which the $PbSr_3Mn_2O_8$ magnetoresistive oxide was evaporated on a $SrTiO_3$ substrate to form a $PbSr_3Mn_2O_8$ magnetoresistive oxide thin film on the $SrTiO_3$ substrate.

A crystal structure of the $PbSr_3Mn_2O_8$ magnetoresistive oxide prepared was analyzed by an X-ray diffraction. It was confirmed that the crystal structure of the $PbSr_3Mn_2O_8$ magnetoresistive oxide was a perovskite related structure having two dimensional layers comprising lead elements and oxygen elements.

The $PbSr_3Mn_2O_8$ magnetoresistive oxide prepared was attached with first terminals for supplying a current and second terminals for detecting voltage so that a magnetoresistance of the $PbSr_3Mn_2O_8$ magnetoresistive oxide was measured from a difference in electric resistance obtained from a ratio of an output voltage measured to an input current between when no external magnetic field was applied to the magnetoresistive oxide and when a predetermined magnetic field was applied to the magnetoresistive oxide.

First, the electric resistance of the $PbSr_3Mn_2O_8$ magnetoresistive oxide was measured under no external magnetic field. At a temperature in the vicinity of room temperature, the variation in measured electric resistivity of the $PbSr_3Mn_2O_8$ magnetoresistive oxide was 50 m $\Omega$ cm At a temperature in the vicinity of 250 K, the variation in measured electric resistivity of the $PbSr_3Mn_2O_8$ magnetoresistive oxide was largest. At the temperatures below 250 K, the measured electric resistivity was largely reduced and the $PbSr_3Mn_2O_8$ magnetoresistive oxide showed a large electric conductivity like metals. The temperature in the vicinity of 250 K was almost equal to a magnetic transition temperature at which a magnetic transition from paramagnetism to ferromagnetism of the $PbSr_3Mn_2O_8$ magnetoresistive oxide.

Second, the electric resistance of the $PbSr_3Mn_2O_8$ magnetoresistive oxide was measured under variable and weak external magnetic fields at a temperature in the vicinity of 250 K. As the external magnetic field applied to the $PbSr_3Mn_2O_8$ magnetoresistive oxide was gradually increased from 0 tesla, the electric resistance of the $PbSr_3Mn_2O_8$ magnetoresistive oxide was reduced. At the external magnetic field was 6 teslas, the electric resistance thereof was reduced by approximately 80%, namely varied by approximately −80%. Thus, the measured magnetoresistance effect was −80% at a temperature in the vicinity of 250 K under a magnetic field of 6 teslas.

An eighth example according to the present invention will be described, wherein TlSrRuO magnetoresistive oxide was prepared. As source materials, $Tl_2O_3$, SrO and $RuO_2$ were determined so that a molar ratio of Tl:Sr:Ru was equal to 1:2:1 for subsequent mixing of $Tl_2O_3$, SrO and $RuO_2$. The mixture was pressed to be in a predetermined shape for subsequent burning thereof under a pressure of 3 GPa at a temperature of 1000° C. for one hour. As a result, TlSrRuO magnetoresistive oxide was obtained.

A crystal structure of the TlSrRuO magnetoresistive oxide prepared was analyzed by an X-ray diffraction. It was confirmed that the crystal structure of the TlSrRuO magnetoresistive oxide was a perovskite related structure having including ruthenium ions. It was difficult to synthesize this compound TlSrRuO magnetoresistive oxide under normal pressure.

The TlSrRuO magnetoresistive oxide prepared was attached with first terminals for supplying a current and second terminals for detecting voltage so that a magnetoresistance of the TlSrRuO magnetoresistive oxide was measured from a difference in electric resistance obtained from a ratio of an output voltage measured to an input current between when no external magnetic field was applied to the magnetoresistive oxide and when a predetermined magnetic field was applied to the magnetoresistive oxide.

First, the electric resistance of the TlSrRuO magnetoresistive oxide was measured under no external magnetic field. At a temperature in the vicinity of 130 K, the variation in measured electric resistivity of the TlSrRuO magnetoresistive oxide was largest. At the temperatures below 130 K, the measured electric resistivity was largely reduced and the TlSrRuO magnetoresistive oxide showed a large electric conductivity like metals. The temperature in the vicinity of 130 K was almost equal to a magnetic transition temperature at which a magnetic transition from paramagnetism to ferromagnetism of the TlSrRuO magnetoresistive oxide.

Second, the electric resistance of the TlSrRuO magnetoresistive oxide was measured under variable and weak external magnetic fields at a temperature in the vicinity of 130 K. As the external magnetic field applied to the TlSrRuO magnetoresistive oxide was gradually increased from 0 tesla, the electric resistance of the TlSrRuO magnetoresistive oxide was reduced. At the external magnetic field was 6 teslas, the electric resistance thereof was reduced by approximately 60%, namely varied by approximately −60%. Thus, the measured magnetoresistance effect was −60% at a temperature in the vicinity of 130 K under a magnetic field of 6 teslas.

A ninth example according to the present invention will be described, wherein $Bi_2Ba_2OsO_6$ magnetoresistive oxide was prepared. As source materials, $Bi_2O_3$, BaO and $OsO_4$ were determined so that a molar ratio of Bi:Ba:Os was equal to 2:2:1 for subsequent mixing of $Bi_2O_3$, BaO and OsO4. The mixture was pressed to be in a predetermined shape for subsequent burning thereof at a temperature of 980° C. for five hours. As a result, $Bi_2Ba_2OsO_6$ magnetoresistive oxide was obtained.

A crystal structure of the $Bi_2Ba_2OsO_6$ magnetoresistive oxide prepared was analyzed by an X-ray diffraction. It was confirmed that the crystal structure of the $Bi_2Ba_2OsO_6$ magnetoresistive oxide was a perovskite related structure having including osmium ions.

The $Bi_2Ba_2OsO_6$ magnetoresistive oxide was worked to be in the form of stick-like shape. In accordance with the floating zone method, the stick-like $Bi_2Ba_2OsO_6$ magnetoresistive oxide samples were melt at a temperature of about 2000° C. and then solidified to obtain a monocrystal $Bi_2Ba_2OsO_6$ magnetoresistive oxide having the perovskite related structure having including osmium ions.

The monocrystal $Bi_2Ba_2OsO_6$ magnetoresistive oxide prepared was attached with first terminals for supplying a current and second terminals for detecting voltage so that a magnetoresistance of the monocrystal $Bi_2Ba_2OsO_6$ magnetoresistive oxide was measured from a difference in electric resistance obtained from a ratio of an output voltage measured to an input current between when no external magnetic field was applied to the magnetoresistive oxide and when a predetermined magnetic field was applied to the magnetoresistive oxide.

First, the electric resistance of the monocrystal $Bi_2Ba_2OsO_6$ magnetoresistive oxide was measured under no external magnetic field. At a temperature in the vicinity of room temperature, the measured electric resistivity of the monocrystal $Bi_2Ba_2OsO_6$ magnetoresistive oxide was approximately 50 m $\Omega$ cm. At a temperature in the vicinity of 180 K, the variation in measured electric resistivity of the monocrystal $Bi_2Ba_2OsO_6$ magnetoresistive oxide was largest. At the temperatures below 180 K, the measured electric resistivity was largely reduced and the monocrystal $Bi_2Ba_2OsO_6$ magnetoresistive oxide showed a large electric conductivity like metals. The temperature in the vicinity of 180 K was almost equal to a magnetic transition temperature at which a magnetic transition from paramagnetism to ferromagnetism of the monocrystal $Bi_2Ba_2OsO_6$ magnetoresistive oxide.

Second, the electric resistance of the monocrystal $Bi_2Ba_2OsO_6$ magnetoresistive oxide was measured under variable and weak external magnetic fields at a temperature in the vicinity of 180 K. As the external magnetic field applied to the monocrystal $Bi_2Ba_2OsO_6$ magnetoresistive oxide was gradually increased from 0 tesla, the electric resistance of the monocrystal $Bi_2Ba_2OsO_6$ magnetoresistive oxide was reduced. At the external magnetic field was 6 teslas, the electric resistance thereof was reduced by approximately 80%, namely varied by approximately −80%. Thus, the measured magnetoresistance effect was −80% at a temperature in the vicinity of 180 K under a magnetic field of 6 teslas.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A magnetoresistive material having a layered perovskite structure and being represented by $(TlO)_m(R_{n+1}Mn_nO_{3n+1})$, where: R is selected from the group consisting of alkaline earth metals; m is equal to 1 or 2; and $1 \leq n \leq 4$.

2. The magnetoresistive material as claimed in claim 1, wherein said magnetoresistive material comprises TlSrMnO, where a molar ratio of Tl:Sr:Mn is equal to 1:2:1.

3. The magnetoresistive material as claimed in claim 2, wherein said magnetoresistive material is prepared by mixing $Tl_2O_3$, SrO and MnO and subsequent burning thereof at a temperature of about 900° C. for about five hours.

4. The magnetoresistive material as claimed in claim 1, wherein said magnetoresistive material comprises TlSrMnO, where a molar ratio of Tl:Sr:Mn is equal to 1:3:2.

5. The magnetoresistive material as claimed in claim 4, wherein said magnetoresistive material is prepared by mixing $Tl_2O_3$, SrO and MnO and subsequent burning thereof in an oxygen atmosphere at a temperature of about 900° C. for about five hours.

6. The magnetoresistive material as claimed in claim 4, wherein said magnetoresistive material is prepared by mixing $Tl_2O_3$, SrO and MnO and subsequent burning thereof in an argon atmosphere at a temperature of about 900° C. for about five hours.

7. A magnetoresistive material having a layered perovskite structure, said magnetoresistive material being prepared by mixing $Bi_2O_3$, SrO, and MnO and subsequent burning thereof.

8. The magnetoresistive material as claimed in claim 7, wherein said magnetoresistive material is burned at a temperature of about 940° C. for about five hours.

9. A magnetoresistive material having a layered perovskite structure, said magnetoresistive material being prepared by mixing HgO, SrO, $La_2O_3$, and MnO and subsequent burning thereof.

10. The magnetoresistive material as claimed in claim 9, wherein said magnetoresistive material is burned at a temperature of about 700° C. for about five hours.

11. A magnetoresistive material having a layered perovskite structure and being represented by $PbSr_3Mn_2O_8$.

12. The magnetoresistive material as claimed in claim 11, wherein said magnetoresistive material $PbSr_3Mn_2O_8$ is prepared by mixing PbO, SrO, and MnO and subsequent burning thereof at a temperature of about 750° C. for about twelve hours.

13. A magnetoresistive material having a layered perovskite structure, said magnetoresistive material being prepared by mixing $Tl_2O_3$, SrO, and $RuO_2$ and subsequent burning thereof.

14. The magnetoresistive material as claimed in claims 13, wherein said magnetoresistive material is burned under a pressure of about 3 GPa at a temperature of about 1000° C. for about one hour.

15. A magnetoresistive material having a layered perovskite structure and being represented by $Bi_2Ba_2OsO_6$, where a molar ratio of Bi:Ba:Os is equal to 2:2:1.

16. The magnetoresistive material as claimed in claim 15, wherein said magnetoresistive material $Bi_2Ba_2OsO_6$ is prepared by mixing $Bi_2O_3$, BaO, and $OsO_4$ and subsequent burning thereof at a temperature of about 980° C. for about five hours.

17. A magnetic sensor made of a magnetoresistive material having a layered perovskite structure and being represented by $(TlO)_m(R_{n+1}Mn_nO_{3n+1})$, where: R is selected from the group consisting of alkaline earth metals; m is equal to 1 or 2; and $1 \leq n \leq 4$.

18. The magnetic sensor as claimed in claim 17, wherein said magnetoresistive material comprises TlSrMnO, where a molar ratio of Tl:Sr:Mn is equal to 1:2:1.

19. The magnetic sensor as claimed in claim 18, wherein said magnetoresistive material is prepared by mixing $Tl_2O_3$, Sro and Mno and subsequent burning thereof at temperature of about 900° C. for about five hours.

20. The magnetic sensor as claimed in claim 17, wherein said magnetoresistive material comprises TlSrMnO, where a molar ratio of Tl:Sr:Mn is equal to 1:3:2.

21. The magnetic sensor as claimed in claim 20, wherein said magnetoresistive material is prepared by mixing $Tl_2O_3$, SrO and MnO and subsequent burning thereof in an oxygen atmosphere at a temperature of about 900° C. for about five hours.

22. The magnetic sensor as claimed in claim 20, wherein said magnetoresistive material is prepared by mixing $Tl_2O_3$, SrO and MnO and subsequent burning thereof in an argon atmosphere at a temperature of about 900° C. for about five hours.

23. The magnetic sensor as claimed in claim 17, wherein said magnetoresistive material is in the form of a thin film provided on a substrate.

24. A magnetic sensor made of a magnetoresistive material having a layered perovskite structure prepared by the method of claim 7.

25. The magnetic sensor as claimed in claim 24, wherein said magnetoresistive material is burned at a temperature of about 940° C. for about five hours.

26. A magnetic sensor made of a magnetoresistive material having a layered perovskite structure, said magnetoresistive material being prepared by the method of claim 9.

27. The magnetic sensor as claimed in claim 26, wherein said magnetoresistive material is burned at a temperature of about 700° C. for about five hours.

28. A magnetic sensor made of a magnetoresistive material having a layered perovskite structure and being represented by $PbSr_3Mn_2O_8$.

29. The magnetoresistive material as claimed in claim 28, wherein said magnetoresistive material $PbSr_3Mn_2O_8$ is prepared by mixing PbO, SrO, and MnO and subsequent burning thereof at a temperature of about 750° C. for about twelve hours.

30. A magnetic sensor made of a magnetoresistive material having a layered perovskite structure, said magnetoresistive material being prepared by the method of claim 13.

31. The magnetic sensor as claimed in claim 30, wherein said magnetoresistive material is burned under a pressure of about 3 GPa at a temperature of about 1000° C. for about one hour.

32. A magnetic sensor made of a magnetoresistive material having a layered perovskite structure and being represented by $Bi_2Ba_2OsO_6$, where a molar ratio of Bi:Ba:Os is equal to 2:2:1.

33. The magnetic sensor as claimed in claim 32, wherein said magnetoresistive material $Bi_2Ba_2OsO_6$ is prepared by mixing $Bi_2O_3$, BaO, and $OsO_4$ and subsequent burning thereof at a temperature of about 980° C. for about five hours.

34. A method for preparing a magnetoresistive material having a layered perovskite structure and being represented by $Bi_2Ba_2OsO_6$, said method comprising the steps of mixing $Bi_2O_3$, BaO, and $OsO_4$ so that a molar ratio of Bi:Ba:Os is equal to 2:2:1 for subsequent burning thereof at a temperature of about 980° C. for about five hours.

* * * * *